(12) United States Patent
Gärtner et al.

(10) Patent No.: US 6,528,433 B2
(45) Date of Patent: Mar. 4, 2003

(54) METHOD FOR MONITORING NITROGEN PROCESSES

(75) Inventors: Thomas Gärtner, Ottendorf-Okrilla (DE); Alexandra Lamprecht, Dresden (DE); Dietmar Ottenwälder, Dresden (DE); Jörg Schulze, Liegau-Augustusbad (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/881,432

(22) Filed: Jun. 14, 2001

(65) Prior Publication Data

US 2001/0055824 A1 Dec. 27, 2001

(30) Foreign Application Priority Data

Jun. 14, 2000 (DE) .......................... 100 29 286

(51) Int. Cl.⁷ ........................................... H01L 21/469
(52) U.S. Cl. ....................................... 438/786
(58) Field of Search ................. 438/786, 700, 438/162, 264, 106, 795

(56) References Cited

U.S. PATENT DOCUMENTS

| | | | |
|---|---|---|---|
| 5,541,436 A | * 7/1996 | Kwong | ............... 257/410 |
| 5,672,521 A | 9/1997 | Barsan et al. | |
| 5,939,763 A | 8/1999 | Hao et al. | |
| 6,033,998 A | * 3/2000 | Aronowitz | ............... 438/786 |

FOREIGN PATENT DOCUMENTS

EP  0 631 308 A2  12/1994

EP  0 977 266 A1  2/2000

OTHER PUBLICATIONS

Green, M.L. et al.: "Growth of Silicon Oxynitride Films in NO–O₂ Gas Mixtures", Electrochemical Society Proceedings, vol. 98–1, pp. 745–759.
Yao, Z.–Q. et al.: "High quality ultrathin dielectric films grown on silicon in a nitric oxide ambient", Appl. Phys. Lett., vol. 64, No. 26, Jun. 27, 1994, pp. 3584–3586.
Hegde, Rama I. Et al.: "Growth and Film Characteristics of N₂O and NO Oxynitride Gate and Tunnel Dielectrics", J. Electrochem. Soc., vol. 144, No. 3, Mar. 1997, pp. 1081–1086.
Kim, M.J. et al. "Characterization of Implanted Nitride for VLSI Applications", J. Electrochem. Soc.: Solid State Science And Technology, vol. 131, No. 8, Aug. 1984, pp. 1934–1941.
Berruyer, Pascale et al.: "Nitrogen implantation for local inhibition of oxidation", Appl. Phys. Lett., vol. 50, No. 2, Jan. 12, 1987, pp. 89–91.

* cited by examiner

*Primary Examiner*—John F. Niebling
*Assistant Examiner*—Andre' C Stevenson
(74) *Attorney, Agent, or Firm*—Laurence A. Greenberg; Werner H. Stemer; Ralph E. Locher

(57) ABSTRACT

The novel method allows monitoring of nitrogen processes by making use of the fact that the incorporation of nitrogen near the surface in silicon, or in a thin silicon nitride layer on the silicon surface, inhibits the diffusion of oxygen during the subsequent thermal oxidation. Accordingly, the oxidation rate of the thermal oxidation is reduced and the growth of the oxide layer on the silicon surface is inhibited. The thickness of the oxide layer is thus used as a measure for the nitrogen content, i.e., for the quality of the nitrogen process.

12 Claims, 2 Drawing Sheets

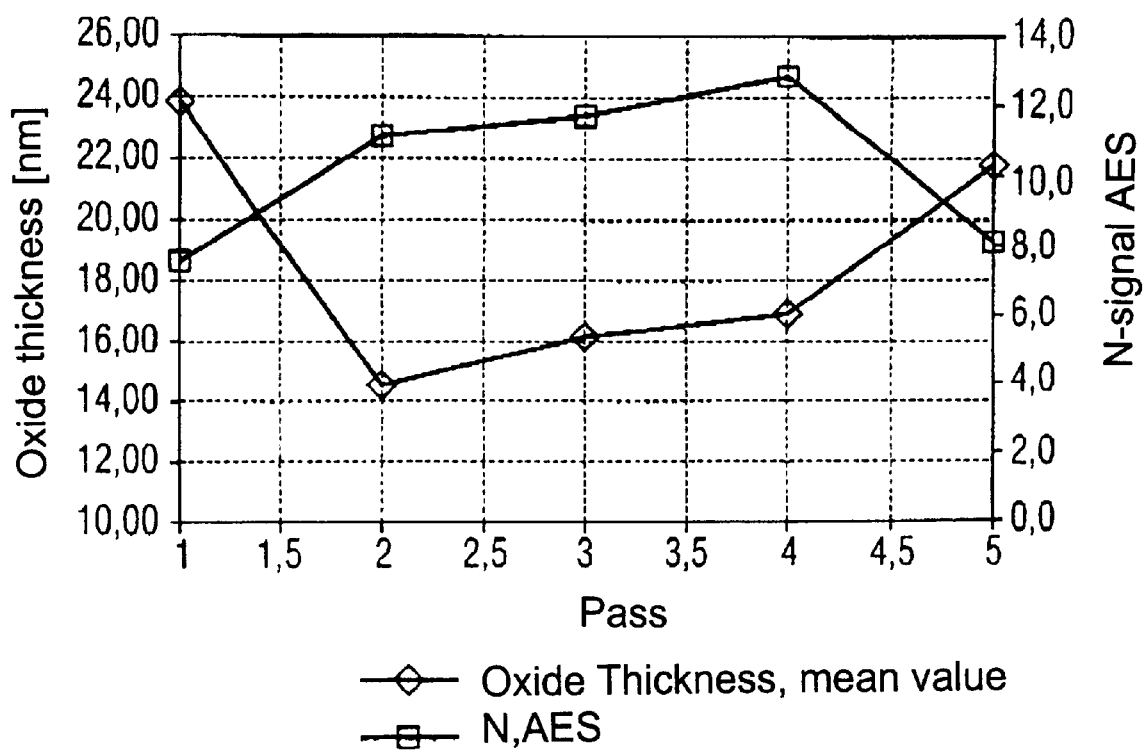

METHOD FOR MONITORING NITROGEN PROCESSES

BACKGROUND OF THE INVENTION

FIELD OF THE INVENTION

This invention concerns a process for monitoring nitrogen processes. The invention concerns in particular a method for monitoring nitrogen processes in semiconductor manufacture.

In the manufacture of integrated semiconductor components there is frequently a need for nitrogen processes for the fabrication of nitride layers and/or nitrogen processes for the insertion of nitrogen into already existing layers of material. Typical examples of nitrogen processes of that kind are the fabrication of a silicon nitride layer as a memory dielectric or as part of the memory dielectric in storage capacitors, the fabrication of a silicon nitride layer as a mask layer for the LOCO method, or the fabrication of silicon nitride layers as so-called "pad nitride," which are used as stop layers for etching or polishing. Furthermore, nitride layers and oxynitride layers are used as tunnel layers at the boundary layer between a buried contact and the conductive filling of a trench capacitor. A tunnel layer of that kind is described in the commonly assigned European patent application EP 0 977 266 A1, which is herewith incorporated by reference (see also, copending applications Ser. Nos. 09/232,081 and 09/363,277, which are also incorporated by reference). The fabrication of an exactly defined nitride or oxynitride layer is of especially great importance in the last-named application. The specifications set for the nitrogen processes used must therefore be correspondingly high.

In prior art, the nitrogen processes were monitored as a rule using secondary ion mass spectrometry (SIMS) or Auger electron spectroscopy (AES). In secondary ion mass spectroscopy the surface to be tested, in this case—for example—a nitride or oxynitride layer, is bombarded under high vacuum with a primary ion beam (O, Cl, Ar, or other gases) which causes ionized particles to be ejected from the surface. These secondary ions are then analyzed in a mass spectrometer. Secondary ion mass spectrometry has the advantage that all elements (including isotopes) can be detected in concentrations down to the ppb range. In this way conclusions can be drawn about the nitrogen content of the layer under investigation, and therefore about the quality of the nitrogen process used.

In Auger electron spectroscopy the sample surface is bombarded with a primary electron beam, through which the atoms at the sample surface are ionized in a low-lying energy level (K or L shell). If the hole in the low-lying energy level is reoccupied by an electron from a higher-lying energy level, the energy released can be transferred without radiation to a further electron in a higher energy level, which then leaves the atom as a so-called "Auger electron." Measurement of the kinetic energy of the Auger electrons enables the kind of atom in the sample surface to be determined. Since Auger electrons emitted from a sample surface are only generated at a very shallow depth, Auger electron spectroscopy is a very powerful method for analyzing the thinnest of surface layers.

Unfortunately, both secondary ion spectrometry and Auger electron spectroscopy are very complicated and therefore very costly methods, which cannot normally be used in a production environment.

SUMMARY OF THE INVENTION

The object of the present invention is to provide a method for monitoring nitrogen processes which overcomes the above-noted deficiencies and disadvantages of the prior art devices and methods of this general kind, and which reduces or completely avoids the above disadvantages. In particular, it is the object of the invention to provide for a method for monitoring nitrogen processes which is capable of determining the quality of the nitrogen process in a simple manner and at reasonable cost.

With the above and other objects in view there is provided, in accordance with the invention, a method of monitoring nitrogen processes, which comprises the following steps:

providing a silicon surface;

subjecting the silicon surface to a nitrogen process;

producing an oxide layer on the silicon surface by thermal oxidation for a specified duration; and determining a thickness of the oxide layer as a measure for a quality of the nitrogen process.

The novel method for monitoring nitrogen processes makes use of the fact that the incorporation of nitrogen near the surface in the silicon, or in a thin silicon nitride layer on the surface of the silicon, inhibits oxygen diffusion during the subsequent thermal oxidation. Correspondingly, the oxidation rate of the thermal oxidation is reduced and the growth of the oxide layer on the silicon surface is inhibited. The thickness of the oxide layer can therefore be used as a measure for the nitrogen content, i.e. for the quality of the nitrogen process.

The prior art methods used for monitoring nitrogen processes (SIMS, AES) are based on direct observation of the nitrogen atoms. However, such direct proofs of a particular type of atom are very complicated. The method according to the invention does without a direct proof of the nitrogen atoms, whereby the monitoring of nitrogen processes can be performed considerably faster and at less cost. The method according to the invention also has the advantage that the test wafer used as a rule for the monitoring is not destroyed as a result of this monitoring and can therefore be used as a so-called "dummy" in further processes.

According to a preferred implementation, the oxide layer is fabricated through a thermal oxidation at a temperature between 800° C. and 1100° C., preferably at 900 C. In addition, it is preferred if the oxide layer is fabricated through a thermal oxidation over a duration of 10 to 30 minutes, preferably 20 minutes. In doing this, it is especially preferred if the oxide layer is fabricated as wet oxide.

The thickness of the oxide layer can be determined using several different methods. For example, the thickness of the oxide layer can be measured using laser interferometry. According to a further preferred implementation the thickness of the oxide layer is determined by ellipsometry. Moreover, it is preferred if the silicon surface is cleaned using a wet chemical method before the nitrogen process and, especially, if the so-called "natural oxide" is removed from the silicon surface.

Other features which are considered as characteristic for the invention are set forth in the appended claims.

Although the invention is illustrated and described herein as embodied in a method for Monitoring Nitrogen Processes, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a chart graphing a comparison of the measured values from the method according to the invention with the measured values from Auger electron spectroscopy.

DESCRIPTION OF THE PREFERRED EMBODIMENTS

Figure 1:
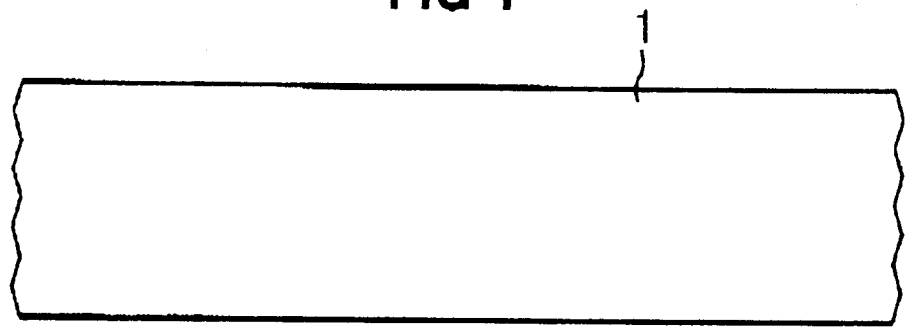
FIGS. 1–3 are sequential partial diagrammatic side views illustrating an implementation of the method according to the invention.
Figure 2:
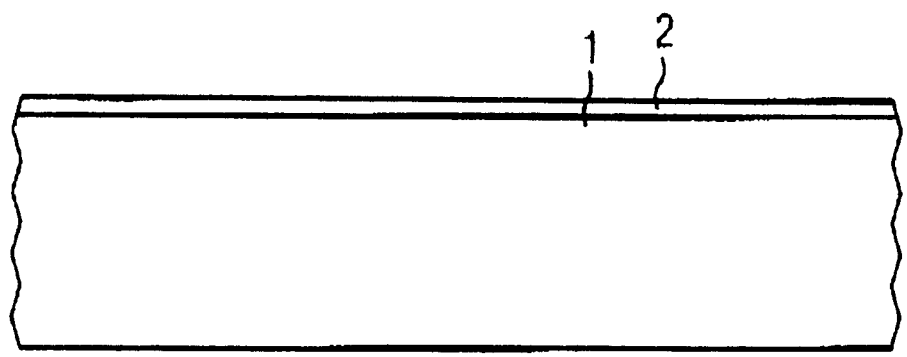
Figure 3:
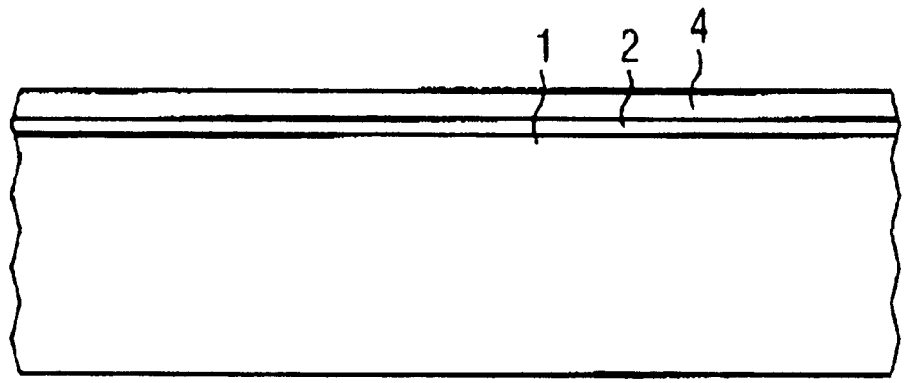

Referring now to the figures of the drawing in detail and first, particularly, to FIGS. 1 to 3 thereof, there is seen an essentially monocrystalline silicon substrate 1, from the surface 2 of which the so-called natural oxide was removed using wet chemical cleaning (HF dip). The silicon substrate 1 has the shape of a wafer and it is subjected to a nitrogen process as a test wafer along with further production wafers.

In this example the silicon substrate 1 is subjected to a thermal treatment under an atmosphere of $NH_3$ or $N_2$. For example, a thermal nitride tunnel layer can be formed in a vertical furnace for several wafers at 780° C. and 1 torr under an atmosphere of $NH_3$. Alternatively, a thermal nitride tunnel layer can be formed in a single-wafer cluster tool at 800° C. and 100 torr in an atmosphere of $NH_3$. The nitrogen process leads to the incorporation of nitrogen atoms into the silicon surface 2 or to the formation of a silicon nitride layer (oxynitride layer) on the silicon surface 2. The resulting situation is illustrated in FIG. 2.

For monitoring the nitrogen process an oxide layer 4 is fabricated subsequently for a specified duration on the silicon surface 2. This involves the fabrication of the oxide layer through a thermal oxidation. In this example the oxide layer 4 is fabricated as a so-called wet oxide. For this purpose, 8000 sccm of hydrogen $H_2$, 4800 sccm of oxygen $O_2$ and 100 sccm of HCl are applied to the silicon substrate 1 for approximately 20 minutes at a temperature of approximately 900° C. As a result of the thermal oxidation, an oxide layer 4 with a thickness of approximately 25 nm is formed on the silicon surface 2. Had the silicon substrate not been coated with a nitrogen process, the thickness of the oxide layer would be approximately 30 nm. This difference allows a conclusion to be drawn about the quantity of nitrogen and therefore about the quality of the nitrogen process. The resulting structure is illustrated in FIG. 3.

In this example the thickness of the oxide layer 4 is determined by ellipsometry. For this purpose linearly polarized light is directed onto the oxide layer 4 at a specified angle. The light reflected from the surface is generally elliptically polarized. The shape and alignment of the elliptical polarization essentially depends on the reflection characteristics of the irradiated surface. These reflection characteristics of the irradiated surface depend in turn on the thickness of the surface layer, thus enabling this method to be used for determining the thickness of the layer.

FIG. 4 shows a comparison of the measured values from the method according to the invention with the measured values obtained using Auger electron spectroscopy. It can be seen that whenever Auger electron spectroscopy produces a high value for the nitrogen signal, the oxide layer 4 is of low thickness. Accordingly, the method according to the invention contains essentially the same information about the nitrogen content as does the considerably more complicated Auger electron spectroscopy.

Through the use of a relatively simple thermal oxidation and a relatively simple layer thickness determination, it is possible to determine the quality of the nitrogen process by means of the method according to the invention. The method according to the invention thus enables nitrogen processes to be monitored with simple means and at reasonable cost. It can therefore be used for routine monitoring of nitrogen in a production environment.

We claim:

1. A method of monitoring nitrogen processes, which comprises the following steps:

providing a silicon surface;

subjecting the silicon surface to a nitrogen process;

producing an oxide layer on the silicon surface by thermal oxidation for a specified duration;

performing the producing step by fabricating the oxide layer as a wet oxide; and determining a thickness of the oxide layer as a measure for a quality of the nitrogen process.

2. The method according to claim 1, which comprises performing the determining step by determining the thickness of the oxide layer by ellipsometry.

3. A method of monitoring nitrogen processes, which comprises the following steps:

providing a silicon surface;

subjecting the silicon surface to a nitrogen process;

wet-chemically cleaning the silicon surface prior to the subjecting step;

producing an oxide layer on the silicon surface by thermal oxidation for a specified duration; and determining a thickness of the oxide layer as a measure for a quality of the nitrogen process.

4. The method according to claim 1, which comprises thermally treating a silicon substrate under an atmosphere of $NH_3$ or $N_2$.

5. The method according to claim 1, which comprises performing the producing step by thermally oxidizing at a temperature between 800° C. and 1000° C.

6. The method according to claim 1, which comprises performing the producing step by thermally oxidizing at a temperature of substantially 900° C.

7. The method according to claim 1, which comprises performing the producing step by thermally oxidizing over a duration of 10 to 30 minutes.

8. The method according to claim 1, which comprises performing the producing step by thermally oxidizing over a duration of substantially 20 min.

9. The method according to claim 3, which comprises performing the producing step by thermally oxidizing at a temperature between 800° C. and 1100° C.

10. The method according to claim 3, which comprises performing the producing step by thermally oxidizing at a temperature of substantially 900° C.

11. The method according to claim 3, which comprises performing the producing step by thermally oxidizing over a duration of 10 to 30 minutes.

12. The method according to claim 3, which comprises performing the producing step by thermally oxidizing over a duration of substantially 20 min.

* * * * *